(12) United States Patent
Tone et al.

(10) Patent No.: US 6,679,971 B2
(45) Date of Patent: Jan. 20, 2004

(54) FRONT PLATE FOR PLASMA DISPLAY PANELS, AND METHOD OF PRODUCING THE SAME

(75) Inventors: Masashi Tone, Tokyo (JP); Shun Hasegawa, Chiba (JP); Gen Masuda, Chiba (JP); Yasushi Hasegawa, Tokyo (JP); Yatsuhiro Hasegawa, Yachiyo (JP); Shigekazu Hasegawa, Yachiyo (JP)

(73) Assignees: Nisshinbo Industries, Inc., Tokyo (JP); Hasegawa Chemical Industry Co., Ltd., Yachiyo (JP)

(*) Notice: Subject to any disclaimer, the term of this patent is extended or adjusted under 35 U.S.C. 154(b) by 169 days.

(21) Appl. No.: 09/924,942

(22) Filed: Aug. 9, 2001

(65) Prior Publication Data

US 2002/0050321 A1 May 2, 2002

(30) Foreign Application Priority Data

Aug. 10, 2000 (JP) .......... 2000-242682
Nov. 7, 2000 (JP) .......... 2000-339373

(51) Int. Cl.$^7$ .................................................. C09J 5/10
(52) U.S. Cl. .................. 156/306.6; 156/307.7; 428/432; 359/359
(58) Field of Search .................. 156/306.6, 306.9, 156/307.7; 359/359, 360; 428/426, 432

(56) References Cited

U.S. PATENT DOCUMENTS 4,965,408 A  10/1990  Chapman et al. .......... 174/35
6,429,587 B1 * 8/2002 Sugimachi .................. 313/582

FOREIGN PATENT DOCUMENTS

| EP | 0910107 | 4/1999 |
| EP | 0949648 | 10/1999 |
| EP | 0977167 | 2/2000 |
| EP | 1196018 | 4/2002 |
| JP | 09-330666 | 12/1997 |
| JP | 11-292575 | 10/1999 |
| JP | 2000-028813 | 1/2000 |

OTHER PUBLICATIONS

European Search Report dated Jul. 19, 2002.

* cited by examiner

Primary Examiner—Michael W. Ball
Assistant Examiner—Todd J. Kilkenny
(74) Attorney, Agent, or Firm—Westerman, Hattori, Daniels & Adrian, LLP (57) ABSTRACT

The present invention provides a front plate for plasma display panels with the transparent substrate, electroconductive member and optical film fast adhered to each other, easily produced by a simple process, and excellent in productivity. The present invention further provides a method of producing the same. The present invention provides a front plate for plasma display panels comprising a transparent substrate laminated, at least on one side, with an electroconductive member and at least one type of optical film to form a monolithic structure, wherein (a) two types of adhesive layers of tackifier layer and heat-bond film are orderly placed between the optical film as the outermost layer and the adjacent member, and (b) the transparent substrate, electroconductive member and at least one type of optical film are pressed under heating.

16 Claims, 5 Drawing Sheets

7 Anti-reflection (AR) film
8 Tackifier layer
9 Heat-bond film
10 Near-infrared ray shielding (reflecting) film
8 Tackifier layer
9 Heat-bond film
4 Transparent substrate (of glass)
11 Electroconductive fiber mesh
9 Heat-bond film
8 Tackifier layer
7 Anti-reflection (AR) film bonded to each other by hot pressing to form the monolithic structure

20 Electrode section

- 7 Anti-reflection (AR) film
- 19 Tackifier layer containing a color-correcting component
- 9 Heat-bond film
- 4 Transparent substrate (of glass plate)
- 18 Transparent electroconductive layer
- 9 Heat-bond film
- 8 Tackifier layer
- 7 Anti-reflection (AR) film bonded to each other by hot pressing to form the monolithic structure

[Figure 6]

- 7 Anti-reflection (AR) film
- 8 Tackifier layer
- 10 Near-infrared ray shielding (reflecting) film
- 9 Heat-bond film
- 4 Transparent substrate (of acrylic plate)
- 9 Heat-bond film
- 12 Electroconductive metal net
- 9 Heat-bond film
- 8 Tackifier layer
- 7 Anti-reflection (AR) film bonded to each other by hot pressing to form the monolithic structure

- 4 Transparent substrate (of glass plate)
- 13 Electroconductive metal net
- 9 Heat-bond film
- 15 Near-infrared ray (NIR) absorbing layer
- 14 Transparent film
- 16 Anti-dizziness layer
- 17 Low-reflection layer bonded to each other by hot pressing to form the monolithic structure

[Figure 10]

- 7 Anti-reflection (AR) film
- 8 Tackifier layer
- 10 Near-infrared ray shielding (reflecting) film
- 8 Tackifier layer
- 4 Transparent substrate (of glass plate)
- 11 Electroconductive fiber mesh
- 9 Heat-bond film
- 8 Tackifier layer
- 7 Anti-reflection (AR) film bonded to each other by hot pressing to form the monolithic structure

FRONT PLATE FOR PLASMA DISPLAY PANELS, AND METHOD OF PRODUCING THE SAME

TECHNICAL FIELD

This invention relates to a front plate to be disposed on the front of a plasma display panel (hereinafter sometimes referred to as PDP) and method of producing the same, and more particularly to a front plate for plasma display panels, with the component members fast adhering to each other, easily produced by a process comprising simple steps and excellent in productivity, and method of producing the same,

BACKGROUND OF THE INVENTION

It is reported that large quantities of harmful electromagnetic waves of non-ionized ray, e.g., microwaves and radio waves, are emitted from surfaces of displays, e.g., those for a variety of computers (e.g., office and factory automation devices), game machines and TV sets. Recently, adverse effects of these electromagnetic waves on human health have been pointed out, and their interference with other devices gives rise to other problems.

More recently, a plasma display panel (PDP) as light-emitting, planar display panel has been attracting attention as a large-size display excellent in visibility. However, the PDP emits more intense electromagnetic waves leaking out of the front face than the conventional display panel, e.g., cold-cathode ray tube (CRT) or liquid crystal display panel (LCD), and hence is strongly required to have a better electromagnetic shielding function. Moreover, the PDP emits, from the front face, near-infrared ray derived from inert gas, e.g., Ne or Xe gas, contained in the cell. The near-infrared ray has a wavelength close to the wavelength at which remote controllers operate for a variety of home electronic devices, and hence may cause malfunction of these devices. Therefore, the PDP is also strongly required to have a function of sufficiently shielding the near-infrared ray. Furthermore, it is required to have anti-reflection and anti-dizziness functions to improve image quality and visibility, and prevent flickering of the screen.

As described above, the PDP is strongly required to have various functions, e.g., those for shielding electromagnetic waves and near-infrared ray, anti-reflection, and anti-dizziness, depending on its purpose and service types. The front plate adequately provided with some of these functions has been widely used and disposed on the front face of a display panel, in order to satisfy these requirements.

The front plate for PDP's is required to have these functions as a whole, and is generally composed of two or more component members each having one or more of these functions. One of the typical examples comprises a transparent substrate, e.g., glass or acrylic plate, orderly coated with members, e.g., electromagnetic shielding or electroconductive member, near-infrared ray absorbing or reflecting member, and anti-reflection or anti-dizziness member, depending on the required functions. When these component members are formed into a monolithic structure, it is advantageous to bond the two members to each other under heating at elevated temperature and pressure with an adhesive layer in-between, because it can bond these members to each other in one stage. As such, this method, wherein an adhesive film is put between the two component members, is generally followed.

For the front plate for PDP's to have two or more of the above-described functions, it is necessary to coat the transparent substrate with films each having one or more of the functions on one or both sides, normally by hot pressing. In such a method, however, the number of film adhering steps increases as the number of required films increases, causing notably deteriorated productivity and increased production cost.

Moreover, when each of the component members for the front plate for PDP's is required to be large in size and satisfy the specifications more strictly, only a slight deviation in setting before the hot pressing may cause significant problems after these members are assembled. When a heat-bond type film is placed between the component members, in particular, each member tends to move to cause deviation while being set, and more careful setting to prevent the deviation needs much more time and labor.

For the front plate for PDP's with the component members adhered to each other via a heat-bond film, they are commonly assembled into the monolithic structure at elevated temperature. One of the major problems associated with such an assembly is thermal deformation of the optical film as the outermost layer to generate a strain, which can deform the optical film surface and produce fine irregularities on the surface to deteriorate its smoothness. These problems, in turn, cause quality-related problems, e.g., unclear or distorted PDP images through the front plate.

Another type of problem resulting from forming at elevated temperature is thermal shrinkage of the surface optical film, which can warp the front plate as a whole, preventing its smooth setting of a PDP.

Still another type of quality-related problem resulting from forming under severe conditions of elevated temperature is deterioration or alteration of a chemical substance given to the optical film for a function, e.g., near-infrared shielding function, with the result that the front plate may no longer fully exhibit the function.

In order to solve these problems, various types of front plates and front filters for plasma display panel (PDP) have been proposed. For example, Japanese Patent Laid-Open No.330660/1997 discloses a front plate for PDP's which uses a panel comprising a transparent resin plate coated with an electroconductive substance on one side. Japanese Patent Laid-Open Nos. 352318/1999 and 28813/2000 disclose a monolithic assembly with a transparent resin plate and film bonded by hot pressing to each other via an adhesive layer, wherein the film is of polyester or polycarbonate. Japanese Patent Laid-Open No.292575/1999 discloses a monolithic assembly with 2 transparent substrates bonded to each other via an electroconductive mesh as the intermediate layer for bonding.

These proposals, however, have failed to produce the front plate for PDP's free of the above problems, i.e., the front plate excellent in processability for forming a monolithic structure, with each component member resistant to deformation or warping, easily produced by a simple process, and excellent in productivity. Therefore, there are strong demands for development of the front plate for PDP's excellent in functions of, e.g., shielding electromagnetic waves and near-infrared ray and anti-reflection, and free of the above-described problems.

It is an object of the present invention to provide a front plate for plasma display panels free of the above problems involved in the conventional front plate, with the transparent substrate, electroconductive member and optical film fast adhered to each other, easily produced by a simple process, and excellent in productivity. It is another object of the present invention to provide a method of producing the same.

DISCLOSURE OF THE INVENTION

The inventors of the present invention have found, after having extensively studied to solve the above-described problems, that the quality-related problems of the conventional front plate for plasma display panels result from the severe conditions of elevated temperature and pressure under which the component members are assembled into a monolithic structure, and that these problems can be solved by orderly placing two types of adhesive layers of tackifier layer and heat-bond film between the optical film and the adjacent member to press them under heating, when a monolithic assembly of transparent substrate laminated with an electroconductive member and at least one type of optical film is produced, because the component members can be assembled under lower temperature and pressure to give a desired front plate for plasma display panels. This has led to development of the present invention.

The first aspect of the invention provides a front plate for plasma display panels comprising a transparent substrate laminated, at least on one side, with an electroconductive member and at least one type of optical film to form a monolithic structure, wherein (a) two types of adhesive layers of tackifier layer and heat-bond film are orderly placed between the optical film as the outermost layer and the adjacent member, and (b) the transparent substrate, electroconductive member and at least one type of optical film are pressed under heating.

The second aspect of the invention provides the front plate for plasma display panels of the first aspect of the invention, wherein thickness of the two types of adhesive layers is defined by the 10 to 50 μm thick tackifier layer and 50 to 250 μm thick heat-bond film.

The third aspect of the invention provides the front plate for plasma display panels of the first or second aspect of the invention, wherein the optical film has at least one of the functions selected from near-infrared ray shielding, anti-reflection and anti-dizziness functions.

The fourth aspect of the invention provides the front plate for plasma display panels of the third aspect of the invention, wherein the optical film further has a color-correcting function.

The fifth aspect of the invention provides the front plate for plasma display panels of the third or fourth aspect of the invention, wherein the near-infrared shielding function is kept by the film of transparent resin dispersed with a near-infrared absorbing colorant, or a combination of near-infrared absorbing colorant and color-correcting pigment.

The sixth aspect of the invention provides the front plate for plasma display panels of the fifth aspect of the invention, wherein the transparent resin is polycarbonate.

The seventh aspect of the invention provides the front plate for plasma display panels of one of the first to sixth aspects of the invention, wherein the electroconductive member is an electroconductive fiber mesh.

The eighth aspect of the invention provides the front plate for plasma display panels of one of the first to sixth aspects of the invention, wherein the electroconductive member is an electroconductive metal net.

The ninth aspect of the invention provides a method of producing a front plate for plasma display panels, comprising a transparent substrate laminated, at least on one side, with an electroconductive member and at least one type of optical film to form a monolithic structure, wherein (a) two types of adhesive layers of tackifier layer and heat-bond film are orderly placed between the optical film as the outermost layer and the adjacent member, and (b) at least one type of adhesive layer of tackifier layer or heat-bond film is placed or not placed between the members except those of (a) above, and (c) the transparent substrate, electroconductive member and at least one type of optical film are pressed under heating.

The tenth aspect of the invention provides the method of the ninth aspect of the invention, wherein the pressing under heating is effected at 80 to 120° C.

Reference Numerals

1 Front plate for plasma display panels
2 Plasma display panel (PDP)
3 Optical film
4 Transparent substrate (of glass or acrylic plate)
5 Electroconductive member
6 Adhesive layer
7 Anti-reflection (AR) film
8 Tackifier layer
9 Heat-bond film
10 Near-infrared ray shielding (reflecting) film
11 Electroconductive fiber mesh
12 Electroconductive metal net
13 Electroconductive metal net
14 Transparent film
15 Near-infrared ray (NIR) absorbing layer
16 Anti-dizziness layer
17 Low-reflection layer
18 Transparent electroconductive layer
19 Tackifier layer containing a color-correcting component
20 Electrode section

PREFERRED EMBODIMENTS OF THE INVENTION

The present invention is described more concretely.

1. Transparent Substrate

The transparent substrate for the front plate of the present invention for plasma display panels (PDP's) may be in the form of film, sheet or plate, and its size (area) may be adequately set according to size of the display screen for which it is used. Thickness of the transparent substrate is not limited but normally in a range from 0.1 to 10 mm viewed from the relationship between rigidity and weight of the front plate, preferably 1 to 5 mm.

The material for the transparent substrate is normally glass or synthetic resin, although not limited thereto. The synthetic resins useful for the transparent substrate include acrylic resin, polycarbonate, polystyrene and methyl methacrylate/styrene copolymer. Of these, acrylic resin is more prederable, because it can be easily formed to have a desirable size. The glass is preferably a reinforced one treated thermally or chemically, for resistance to impact.

2. Electroconductive Member

The electroconductive member for the front plate of the present invention for plasma display panels (PDP's) works as the member for shielding electromagnetic waves, and the material therefor is not limited so long as it has an electromagnetic wave shielding function.

The examples of the electroconductive member include an electroconductive fiber mesh, transparent electroconductive layer and electroconductive metal net.

The electroconductive fiber mesh, when used for the present invention, is preferably composed of metallized fiber fabric, light, durable and flexible. The method of producing such a fabric is not itself important, and any metallized fiber fabric may be used regardless how it is produced.

Of the metallized fiber fabrics, those suitable for the electroconductive member include a synthetic fiber fabric, e.g., of polyester, surface-treated with a resin and electrolessly plated with 15 to 30% by weight of an electroconductive metal, e.g., nickel or copper, to be electroconductive, and a synthetic fiber mesh, e.g., of polyester, electrolessly plated with an electroconductive metal, e.g., copper, silver or nickel to be electroconductive, and treated for blackening, for their durability and flexibility.

Fiber size for the electroconductive mesh is normally 10 to 60 $\mu$m, and suitable mesh size is 40 to 200 meshes, determined by a Tyler standard screen.

The transparent electroconductive layer can be produced by various methods; e.g., vacuum deposition or sputtering to form at least one transparent, electroconductive layer of metal and/or metal oxide, and coating of a resin dispersed with fine, electroconductive particles of metal and/or metal oxide.

The metals useful for the above purpose include gold, silver, platinum, palladium, copper, titanium, chromium, molybdenum, nickel and zirconium, of which silver is especially preferable for the layer of higher electroconductivity it can give, and its functions of reflecting and shielding waves in the wavelength region of near-infrared ray. When the metallic layer is provided as the electroconductive layer, it is preferably combined with a dielectric layer to form a multi-layer film to prevent reflection by the metallic layer. The examples of the dielectric layer include those of various metal oxides, nitrides and sulfides.

The examples of the metal oxides include silicon oxide, titanium oxide, tantalum oxide, tin oxide, indium oxide, zirconium oxide and zinc oxide, and a compound oxide of indium and tin oxide.

The metals and metal oxides may be used either individually or in combination.

The above electroconductive layer is not required to be formed on a transparent substrate, and may be formed on a resin film, e.g., of polyester, to serve as the electroconductive film.

The electroconductive metal net may be produced by various methods for the present invention; e.g., printing a lattice-like pattern with an electroconductive ink on a transparent substrate, or forming a lattice-like pattern by, e.g., etching, on a thin metallic film of copper, silver, aluminum or the like formed on a transparent substrate. The above lattice-like pattern is not required to be formed on a transparent substrate, and may be formed on a resin film, e.g., of polyester, to serve as the electroconductive film. The electroconductive metal nets useful for the present invention also include a foil of metal, e.g., copper, silver or aluminum, produced by plasticizing treatment, e.g., rolling, to have a given thickness and then provided with a number of holes by, e.g., punching, to have a lattice-like pattern. The lattice-like pattern is preferably 5 to 50 $\mu$m in line width, 1 to 100 $\mu$m in thickness, and 150 to 800 $\mu$m in pitch between the lines, for electromagnetic wave shielding function and transparency.

The electroconductive member is preferably placed between the transparent substrate and optical film to form a monolithic, multi-layered structure for the present invention. Disposition of the member in the above position can reduce warping of the front plate for PDP's. More concretely, for example, the transparent substrate, electroconductive member and optical film are provided in this order, and pressed under heating with an adhesive layer between each pair of these members, to form a monolithic structure.

The electroconductive member may be formed on one or both sides of the transparent substrate to form a monolithic, multi-layer structure for the present invention.

Moreover, two or more electroconductive members of the same or different type may be used. When two or more members are used, they may be disposed on one or both sides of the transparent substrate. The type and combination of the members are not limited.

3. Optical Film

The optical film for the front plate of the present invention for plasma display panels (PDP's) should have at least one of the functions selected from near-infrared ray shielding, anti-reflection and anti-dizziness functions, and preferably has a color-correction function.

The optical film having these functions may be composed one film having two or more functions or two or more films each having one function. Number of the films is not limited.

The optical film serving as the outermost layer for the present invention may be composed one type of optical film, or two or more types of optical films laminated with each other.

The optical film having a near-infrared ray shielding function may be a thin film of near-infrared ray shielding substance (e.g., silver), near-infrared ray shielding colorant or near-infrared ray absorbing substance (e.g., metal oxides) formed on a transparent base film by, e.g., deposition; film of transparent resin dispersed with the near-infrared ray shielding colorant or metal oxide by, e.g., kneading; or near-infrared ray absorbing resin layer, formed by coating a transparent base film by, e.g., casting, with a solution of the near-infrared ray absorbing colorant or metal oxide uniformly mixed with and dispersed in a resin dissolved in a solvent, and then removing the solvent. The film type is not limited, so long as it exhibits a near-infrared ray shielding function.

The near-infrared ray absorbing colorants useful for the present invention include phthalocyanine-, naphthalocyanine-, diimmonium-based colorants and dithiol metal complex, azo compound, and polymethine- and anthraquinone-based colorants.

The metal oxides useful for the present invention include tin-doped indium oxide (ITO) and antimony-doped tin oxide (ATO).

It is preferable that the front plate for PDP's, which includes the optical film provided with a near-infrared ray shielding function, has the transparent substrate having a total ray transmittance of 45% or more for the light in the visible region, and light transmittance of 30% or less for the light having a wavelength in a range from 800 to 1100 nm. The optical film having the above properties can sufficiently secure visibility of the front plate for PDP's while securely preventing malfunction of remote controllers. The light in the visible region has a wavelength in a range from 450 to 650 nm.

The method for providing an anti-reflection and/or anti-dizziness function is not limited, and a known method can be used. The area to be provided with these functions are not limited, but they are preferably provided on the surface of the base film of, e.g., polyester or triacetyl cellulose, where they can be exhibited more efficiently (the film provided with an anti-reflection and/or anti-dizziness function may be referred to as anti-reflection (AR) film).

One of the methods for providing the surface of the base film of, e.g., polyester or triacetyl cellulose, with the laminated layers of the near-infrared shielding and anti-reflection and/or anti-dizziness functions is to coat the base film with the near-infrared shielding layer on one side and anti-reflection and/or anti-dizziness layer on the other side, to form the laminate.

The anti-reflection function can be provided by, e.g., laminating the layer of low-refractive substance (e.g., magnesium fluoride or silicon oxide), or multi-layered anti-reflection layer in which the layer of low-refractive substance is combined with a layer of high-refractive substance (e.g., titanium, tantalum, tin, indium, zirconium or zinc oxide). The particularly preferable multi-layered anti-reflection layer comprises layers of indium oxide/tin oxide (ITO) and silicon oxide, or at least 2 layers of silicon oxide and titanium oxide, because the former gives a better anti-reflection effect and is excellent in surface hardness and adhesion, whereas the latter is excellent in transparency, low in production cost, and also excellent in surface hardness and adhesion.

The method for providing an anti-dizziness function is not limited. For example, the function can be provided by laminating a layer of high-molecular-weight substance dispersed with fine particles to form fine irregularities on the surface.

For the high-molecular-weight layer, a resin of set multi-functional monomer, and silicon-, melamine- and epoxy-based crosslinked resins set by heat or ultraviolet ray are cited as the preferable materials, although not limited thereto.

The fine particles are incorporated to form irregularities on the surface and thereby to reduce its gloss. They are preferably of an inorganic compound.

The fine particles are normally 0.002 to 20 $\mu$m in size, and are incorporated preferably at 1 to 15 parts by weight per 100 parts by weight of the polymerizable compound incorporated.

The inorganic materials useful for the present invention are not limited, but suitable ones include oxides, e.g., silicon dioxide, aluminum oxide, magnesium oxide, tin oxide, silicon monoxide, zirconium oxide and titanium oxide, of which fine particles of silica with silicon dioxide as the main ingredient is particularly suitable, because of its low cost and availability of narrow particle size distribution. The commercially available fine particles of silica include Syloid 72 (Fuji-Davison Chemical), Syloid 244 (Fuji-Davison Chemical), Mizukasil P527 (MIZUSAWA INDUSTRIAL CHEMICALS), and Aerosil TT 600 (Degussa). The fine silica particles may be of agglomerated colloidal silica. The commercially available colloidal silica products include Ludox AM (Dupont Specialty Chemicals), Kieselsol A200 (Bayer AG), and SNOWTEX-C (Nissan Chemical Industries).

The method for providing a color-correcting function is not limited. For example, the function can be provided by dispersing a colorant in the base film of, e.g., polyester or polycarbonate, coating or laminating the base film with a colorant dispersed beforehand in a polymer, e.g., polyethylene terephthalate (PET), or adding a color-correcting dye or pigment to the tackifier layer.

One of the preferred embodiments of the present invention uses an optical film provided with a color-correcting function, wherein the transparent substrate surface may be coated or laminated with a colorant dispersed beforehand in a polymer, e.g., polyethylene terephthalate (PET), within limits not harmful to the object of the present invention.

The optical film for the front plate of the present invention for plasma display panels (PDP's) has at least one of the functions selected from the near-infrared ray shielding, anti-reflection, anti-dizziness and color-correcting functions. The preferred embodiments of the present invention include an assembly of 2 transparent films, one being of, e.g., polyester or triacetyl cellulose, as the optical film coated with an anti-reflection film provided with an anti-reflection function and the other being a transparent film coated with a near-infrared ray shielding film provided with a near-infrared ray shielding function, wherein a color-correcting colorant is dispersed in the base film of, e.g., polyester or polycarbonate, or a color-correcting dye or pigment is dispersed in the tackifier layer, in order to provide the color-correcting function. These desired functions allow the front plate to cut off the near-infrared ray which may interfere with remote controllers, to be anti-reflective to prevent reflection of light coming from the outside, and exhibit hue-correcting characteristics.

In the present invention, the optical film is not required to be provided with all of the above-described near-infrared ray shielding, anti-reflection and anti-dizziness, wherein the optical film is assembled in the functional front plate for PDP's with the transparent substrate provided with some of these functions.

4. Adhesive Layer

The front plate of the present invention for PDP's includes a monolithic structure of transparent substrate coated, at least on one side, with an electroconductive member and at least one type of optical film, particularly characterized by two types of adhesive layers of tackifier layer and heat-bond film orderly placed between the optical film as the outermost layer and the adjacent member. The front plate of such a structure has a highly smooth surface, and is formable at low temperature and of high-quality.

The heat-bond film works as an adhesive agent, handled while it is dry and hence easily. It is formed into a film, disposed between the component members, heated to temperature above its melting point for adhesion reactions, molten to spontaneously move and adhering itself to the members, and cooled and solidified to complete bonding these members to each other.

However, the optical film as the outermost layer is a relatively thin resin film, which keeps its rigidity at normal temperature but is softened when heated only via the heat-bond film disposed immediately below to lose its rigidity. As a result, it will be deformed resulting from movement of the molten heat-bond film to cause problems, e.g., warping of the front plate surface, forming fine irregularities on the plate surface, and deteriorating surface smoothness of the formed plate surface.

Moreover, a thermal shrinkage stress resulting from exposure to heat will remain in the formed optical film to warp the front plate as a whole. The thermal shrinkage stress is more noted in the optical film as the outermost layer.

A number of attempts made to solve these problems have led to development of the front plate of the present invention for PDP's, which includes a monolithic structure of transparent substrate coated, at least on one side, with an electroconductive member and at least one type of optical film, characterized by two types of adhesive layers of tackifier layer and heat-bond film orderly placed at least immediately below the adhesive surface of the optical film as the outermost layer to bond the optical film to the adjacent member under heating to have a monolithic structure.

The tackifier layer, although adhesive at normal temperature, is of a semi-solid, highly viscous liquid, partly crosslinked and hence will not melt under heating to move, unlike the heat-bond film. Therefore, it is adhered to the optical film under heating to keep its rigidity, and also works as the layer for shielding movement of the molten heat-bond film, to greatly prevent deformation of the optical film, and control warping of the surface of the formed film and formation of irregularities on the surface, thereby contributing to keeping smoothness of the surface.

The tackifier layer, having an adequate viscosity, works as a cushion for the internal stress, relaxing the internal stress resulting from the thermal shrinkage of the optical film and thereby prevents deformation, e.g., warping, of the front plate. In particular, presence of the tackifier layer immediately below the optical film as the outermost layer works more effectively also from mechanical point of view. Its effect will be further enhanced for an electroconductive member of mesh shape or specially treated to have metallic properties, because the side on which such an electroconductive member is disposed tends to lose surface smoothness or be fragile to deformation, e.g., warping.

On the other hand, the front plate is formed at as high a temperature as possible to promote the adhesion reactions for the optical film, but adhesion of the optical film is not only satisfactorily effected via the heat-bond film.

In the present invention, however, the tackifier layer adhesive at normal temperature is used in combination of the heat-bond film, and the optical film can be stably adhered when heated at temperature at which the heat-bond film is molten, which is lower than that for the conventional assembly.

As a result, various functional materials for the optical film will not be deteriorated, allowing to produce high-quality front plate for PDP's with excellent functions, and smooth surface resistant to deformation, because the optimum optical film can be adequately selected.

It is essential for the front plate of the present invention for PDP's includes a monolithic structure of transparent substrate coated, at least on one side, with an electroconductive member and at least one type of optical film, wherein two types of adhesive layers of tackifier layer and heat-bond film are orderly placed between the optical film as the outermost layer and the adjacent member. Two types of the adhesive layers may be similarly used or one of these adhesive layers may be used between the other members or the between the members on the other side of the transparent substrate, to bond them under heating.

Moreover, the front plate of the present invention for PDP's may have an electroconductive member and at least one type of optical film only on one side of the transparent substrate, and two types of adhesive layers of tackifier layer and heat-bond film orderly placed between the optical film as the outermost layer and the adjacent member, to bond them under heating. In this case, the transparent substrate may be further laminated, on the other side, with an optional member, e.g., optical film, by a known method that uses an adhesive layer. Such a process is outside of the scope of the present invention.

When the electroconductive member is in the form of mesh or the like having voids through which the adhesive can pass, use of a heat-bond film may eliminate the adhesive layer on one side. In this case, the heat-bond film pass through the member when molten under heating, to form the adhesive layer on that side.

Next, the tackifier layer and heat-bond film are described.

(1) Tackifier Layer

The tackifier for the tackifier layer for the front plate of the present invention for PDP's is a known, pressure-sensitive one, normally semi-solid (highly viscous) liquid, adhesive at normal temperature, and fast adhered to an object under pressure. It is preferably of the type normally used for optical purposes, such as bonding of an optical film to a transparent substrate of glass, acrylic plate or the like. However, it is not limited, so long as it is excellent in desirable properties, e.g., resistance to weather and transparency.

The tackifiers useful for the present invention include acrylic-, polyester-, silicon- and rubber-based ones, of which an acrylic-based one is more preferable for its high resistance to weather and transparency.

The tackifier is a semi-solid (highly viscous) liquid, adequately adhesive at normal temperature under pressure, and can increase in adhesion strength when heated.

The common method for forming the tackifier layer is to spread a tackifier, normally after being diluted with a solvent or emulsified to decrease its viscosity, over an object, and then drying the layer by evaporating the solvent, water or the like. The tackifier layer for the present invention is preferably formed on the optical film, viewed from processability, because it can be handled continuously and efficiently. However, it may be formed on the heat-bond film. The tackifier layer can contribute to surface smoothness and work for the present invention, when it is 5 to 100 $\mu$m thick. It may have an insufficient adhesion strength and lack the effect as the shielding layer when it is thinner, and deteriorated transparency or conversely deteriorated smoothness as a result of possible deformation when it is thicker. The tackifier layer is preferably 10 to 50 $\mu$m thick, because of improved function as the shielding layer and relationship with the heat-bond film.

(2) Heat-bond Film

The heat-bond film useful for the front plate of the present invention for PDP's is made of an adhesive formed in the form of film so that it can be used under a dry condition. It is disposed between the component members, molten under heating to spontaneously adhere itself to the members, and cooled and solidified to complete bonding these members to each other. The heat-bond film is not limited, and known ones can be used.

The typical heat-bond films include those of ethylene/vinyl acetate (EVA) copolymer-, polyamide-, polyurethane-, polyester-, olefin- and acrylic-based resins, of which EVA-, polyamide-, polyurethane- and acrylic-based ones are more preferable for their high transparency. The EVA-based heat-bond film is still more preferable, for its high transparency and availability of diversified types, and being adhesive to a variety of optical films and suffering less temporal changes and aging.

These heat-bond films are normally of thermoplastic resins, which can be formed into films by an adequate means, e.g., extruder for plastics.

The heat-bond film for the present invention is not limited in thickness, but can be used when it is 30 to 300 μm thick for sufficient adhesion strength. It may have insufficient adhesion strength when it is thinner, and cause deterioration of the surface smoothness, due to excessive movement when molten under heating, when it is thicker. For these reasons, the heat-bond film is preferably 50 to 250 μm thick, because of improved relationship with the tackifier layer and surface smoothness.

When two or more heat-bond films are to be used, they may be the same or different in thickness.

One of the preferred embodiments of the present invention uses the heat-bond film formed into a film. However, the transparent substrate or optical film may be coated with a heat-sensitive adhesive, within limits not harmful to the function and effect of the present invention.

5. Method of producing the front plate for plasma display panels

The method of producing the front plate of the present invention for plasma display panels includes laminating the transparent substrate, at least on one side, with an electroconductive member and at least one type of optical film, wherein two types of adhesive layers of tackifier layer and heat-bond film are orderly placed between the optical film as the outermost layer and the adjacent member. More concretely, the optical film and the adjacent member are bonded to each other under hot pressing, with the two adhesive layers, i.e., the tackifier layer disposed on the inner side of the optical film and the adjacent heat-bond film, in-between. The combination of the tackifier layer and heat-bond film allows these members to be fast adhered to each other to form the monolithic structure, even when the heating is effected at relatively low temperature. More concretely, the optical film is fast adhered to the transparent substrate or electroconductive member, to secure sufficient adhesion durability.

The heating for hot pressing these members is effected at 80 to 120° C., preferably 90 to 110° C. Thermal strain of each member may increase at higher than 120° C., possibly resulting in warping of the front plate for PDV's or functional damages of the optical film. At lower than 80° C., on the other hand, adhesive strength may be insufficient for the monolithic structure, possibly causing exfoliation of the film or the like.

Pressure for the hot pressing is not limited, but the satisfactory assembly can be produced at a surface pressure in a range from 0.1 to 20 kg/cm$^2$. At a lower pressure, adhesive power or surface smoothness may be insufficient. At a higher pressure, other troubles may occur, e.g., excessive movement of the molten heat-bond film, possibly causing it to leak out of the assembly, and uneven thickness and deteriorated precision, preventing the film from being formed as designed. The preferable pressure viewed from the above is 0.5 to 15 kg/cm$^2$, at which the film can be formed as designed.

The hot pressing may be effected by various methods, e.g., hot rolling, hot pressing, vacuum hot pressing, vacuum pan heating, rf heating and supersonic heating, of which hot pressing is a common selection and suitably used.

It is recommended to purge air from the laminate inside (degassing) prior to the hot pressing. The common degassing methods suitably used include degassing under pressure using a pressing device, roll or planar press, and vacuum degassing in which the object is thrown into a vacuum device, e.g., vacuum bag or pan.

The members are normally bonded under hot pressing into the formed assembly, while being placed between the mirror-finished plates of metal, plastic, glass or the like. These mirror-finished plates are suitably used to protect the assembly being formed. The method of the present invention allows to bond the front plate members to each other at lower temperature and pressure, reducing thermal strain in each member, preventing warping of the front plate and also preventing the members, e.g., film, from coming off from the assembly as a result of temporal deterioration. The heating at lower temperature also controls thermal deterioration of the light-controlling coating layer for anti-reflection or anti-dizziness for the optical film, and also controls softening of the base film of, e.g., polyester, thereby improving surface smoothness.

The combination of the tackifier layer and heat-bond film efficiently prevents contamination of the front plate with unseen suspended dust by absorbing it in one of the layers, possibly improving product yield. Adhesion of the heat-bond film beforehand with the tackifier layer can simplify the lamination process.

The front plate for PDP's can be assembled by hot pressing in one stage, in spite of its multi-layered structure, at high productivity and low cost, and hence economically.

PREFERRED EMBODIMENTS

The present invention is described more concretely by EXAMPLES with reference to the drawings, which by no means limit the present invention.

EXAMPLE 1

Figure 1:
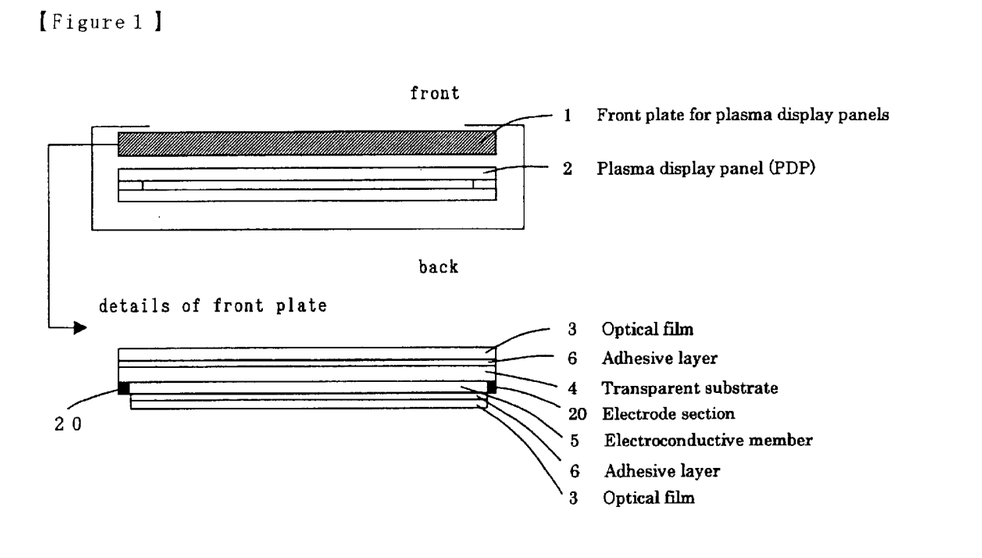
FIG. 1 outlines the front plate of the present invention for plasma display panels and its cross-sectional view.
Figure 2:
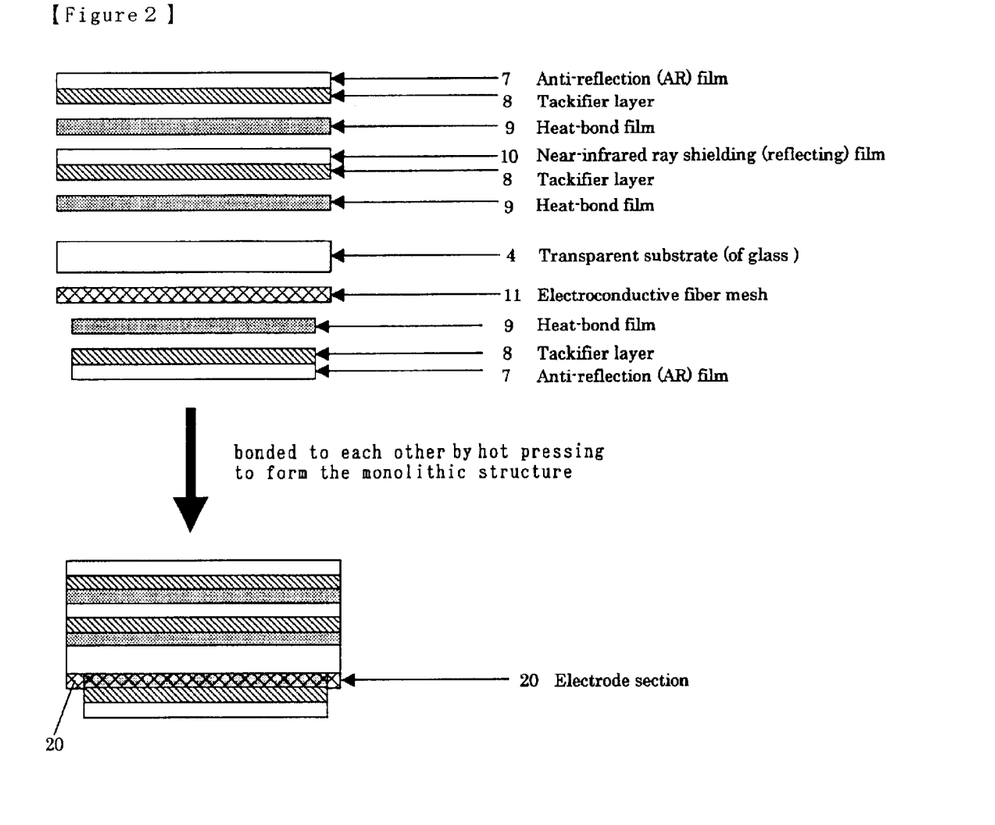
FIG. 2 presents a cross-sectional view of the front plate prepared in EXAMPLE 1 as one embodiment of the present invention.

Outline of the Front Plate for PDP's and Method of Producing the Same (FIGS. 1 and 2)

FIG. 1 outlines the front plate of the present invention for plasma display panels (PDP's) and its cross-sectional view, and FIG. 2 presents the more detailed cross-sectional view of the one embodiment of the front plate of the present invention.

Referring to FIG. 1, the front plate (1) of the present invention, disposed on the front face of a plasma display panel (2), comprised an optical film (3), transparent substrate (4), and electroconductive member (5) which were bonded to each other by hot pressing via adhesive layers (6) to form a monolithic structure, wherein the front plate (1) was totally or partly covered with electrodes (20). Next, FIG. 2 shows a cross-sectional view of the front plate, explaining in more detail the front plate of EXAMPLE 1 as one of the preferred embodiments of the present invention, wherein it comprised an anti-reflection (AR) film (7) as the outermost optical film (3), two adjacent adhesive layers of tackifier layer (8) and heat-bond film (9), near-infrared ray (NIR) absorbing film (10) as the optical film (3), and two adjacent adhesive layers of tackifier layer (8) and heat-bond film (9), laminated in this order on a glass plate (4) as the transparent substrate. The glass plate (4) was coated, on the other side, with an electroconductive fiber mesh (11) as the electroconductive member (5), two adjacent adhesive layers of heat-bond film (9) and tackifier layer (8), and AR film (7) as the outermost optical film (3). The multi-layered assembly was placed between mirror-finished plates, treated for degassing, and hot-pressed at 100° C. and 10 kg/cm$^2$ for 60 minutes, to form the monolithic structure. The electroconductive fiber mesh (11) was fast bonded to the glass plate (4) by the adhesive in the heat-bond film (9), laminated on the outside of the electroconductive fiber mesh (11), molten under heating and penetrating into the voids in the electroconductive fiber mesh (11). In such an assembly, the heat-bond film is not required to be placed between the glass and electroconductive fiber mesh, and it was omitted in the front plate of EXAMPLE 1.

Next, the component members of the front plate are described.

The anti-reflection (AR) (7) (100 μm thick) and acrylic-based, pressure-sensitive tackifier layer (8) (25 μm thick) were commercial AR films provided with a tackifier (NOF CORPORATION, 2201UV).

The heat-bond film (9) was an EVA-based heat-bond film (Nihon Matai, ELFAN OH-501) (thickness: 100 μm and melting point: 83° C.).

The near-infrared ray (NIR) absorbing film (10) comprised a PET film as the base film (Toyobo, A4300, 100 μm thick), near-infrared ray absorbing layer of polycarbonate resin (Teijin Chemical, L-1250Z), and acrylic-based, pressure-sensitive tackifier layer (8) (25 μm thick), wherein the near-infrared ray absorbing layer was dispersed with near-infrared ray absorbing colorants of IRG-022 (NIPPON KAYAKU), NKX-1199 (Hayashibara Seibutsu Kagaku Kenkyujo) and MIR-101 (Midori Kagaku), and color-correcting colorants of Kaya-Sorb violet AR (Nippon Kayaku) and Kaya-Sorb blue N (Nippon Kayaku).

The glass plate (4) was HS-LEX of doubled strength (CENTRAL GLASS), 3 mm thick and 1000 by 600 mm in area.

The electroconductive fiber mesh (11) as the electroconductive member was of MT3-135sss (Nisshin Boseki), 135 by 135 meshes as mesh size and 32 μm in fiber diameter.

The adhesive layer and optical film on the electroconductive member side of the glass plate (4), below the glass plate (4) in the figure, were cut to have external dimensions of 980 by 580 mm in area, smaller than the glass plate (4) and electroconductive fiber mesh (11), and positioned and hot-pressed in such a way that all of the outer peripheries of the electroconductive fiber mesh (11) were exposed and the electrode section (20) was provided over the electroconductive fiber mesh (11). The electrode section (20) served as the electrode for grounding, as it was or after it was covered with an electroconductive, adhesive tape or provided with an electroconductive gasket.

EXAMPLE 2

Figure 3:
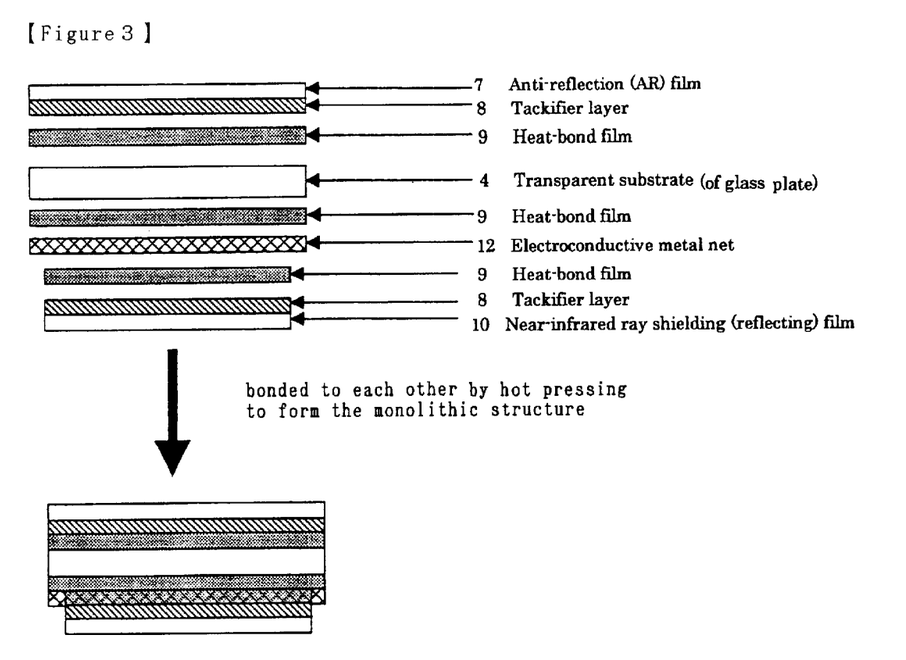
FIG. 3 presents a cross-sectional view of the front plate prepared in EXAMPLE 2 as another embodiment of the present invention.

FIG. 3 is a cross-sectional view of the front plate prepared in EXAMPLE 2, which explains another preferred embodiment of the present invention.

The front plate comprised an anti-reflection (AR) film (7) as the outermost optical film (3), and two adjacent adhesive layers of tackifier layer (8) and heat-bond film (9), which were laminated in this order on the glass plate (4) as the transparent substrate. The glass plate (4) was coated, on the other side, with an electroconductive metal net (12) as the electroconductive member (5) via the heat-bond film (9), two adjacent adhesive layers of heat-bond film (9) and tackifier layer (8), and NIR absorbing film (10) as the outermost optical film, which were laminated in this order. The multi-layered assembly was placed between mirror-finished plates, treated for degassing, and hot-pressed at 100° C. and 10 kg/cm² for 60 minutes, to form the monolithic structure.

The electroconductive metal net (12) as the electroconductive member comprised a PET film coated with a copper layer by electroless plating, wherein the copper layer was chemically etched into the metal mesh film and treated for blackening (line width: 10 μm, line pitch: 280 μm, and thickness: 5 μm).

The near-infrared ray (NIR) absorbing film (10) comprised a PET film as the base film (Toyo Boseki, A4300, 100 μm thick), near-infrared ray absorbing layer of acrylic resin (Mitsubishi Rayon, Acrypet), and acrylic-based, pressure-sensitive tackifier layer (8) (20 μm thick), wherein the near-infrared ray absorbing layer was dispersed with the same near-infrared ray absorbing colorants and color-correcting colorants as those for EXAMPLE 1. The other members were of the same materials as those for EXAMPLE 1. In this example, the electroconductive metal net (12) and glass plate (4) were bonded to each other only via the heat-bond film (9), because they could be bonded sufficiently fast in the absence of a tackifier layer. However, a tackifier layer might be used.

EXAMPLE 3

Figure 4:
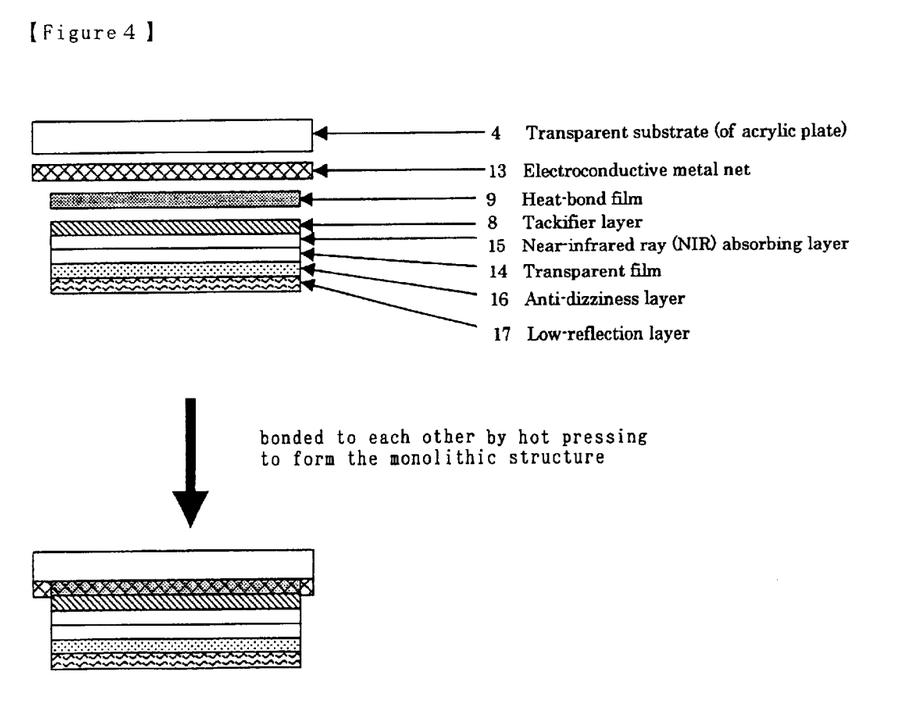
FIG. 4 presents a cross-sectional view of the front plate prepared in EXAMPLE 3 as still another embodiment of the present invention.

FIG. 4 is a cross-sectional view of the front plate comprising an electroconductive member and optical film laminated on one side of a transparent substrate, prepared in EXAMPLE 3, which explains still another preferred embodiment of the present invention.

The front plate comprised an acrylic plate (4) as the transparent substrate, coated with an electroconductive metal mesh (13) as the electroconductive member, two adjacent adhesive layers of heat-bond film (9) and tackifier layer (8), and near-infrared ray absorbing layer (15) as the outermost optical film in this order. It also comprised, on the opposite side, a transparent film (14) provided with an anti-dizziness layer (16) and low-reflection film (17) which were laminated in this order. The multi-layered assembly was placed between mirror-finished plates, treated for degassing, and hot-pressed at 115° C. and 10 kg/cm² for 60 minutes, to form the monolithic structure.

The electroconductive metal net (13) as the electroconductive member was a copper mesh (line width: 25 μm, line pitch: 300 μm, and thickness: 18 μm), and the heat-bond film (9) was an EVA-based heat-bond film (Nihon Matai,ELFAN OH-506) (thickness: 150 μm and melting point: 100° C.).

The optical film (3) comprised a PET film (Toyobo, A4300, 100 μm thick) as the transparent film (14), coated with a polycarbonate resin layer, similar to that for EXAMPLE 1, as the near-infrared ray absorbing layer (15) on one side, and an anti-dizziness layer (16) and low-reflection layer (17) on the other side in this order from the PET film side, wherein a pressure-sensitive, tackifier layer (8) was provided on the near-infrared ray absorbing layer (15). The other members were of the same materials as those for EXAMPLE 1.

In EXAMPLE 3, the electroconductive member and optical film were laminated only on the side of the electroconductive member side of the acrylic plate. However, one or more optical films may be bonded to the side opposite to the electroconductive member, after the front plate is formed, by an adequate method, not limited to hot pressing, e.g., by common roll pressing type lamination.

EXAMPLE 4

Figure 5:
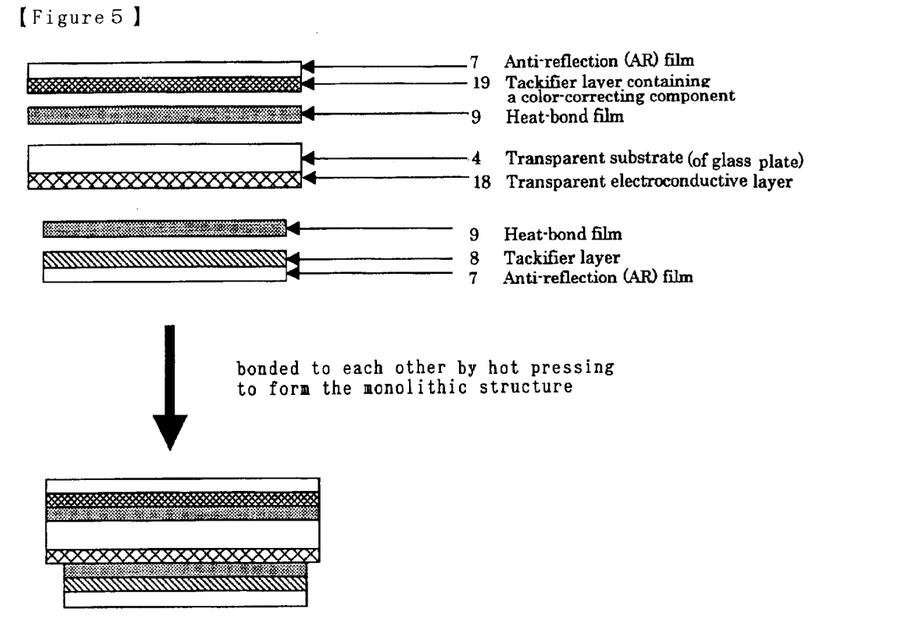
FIG. 5 presents a cross-sectional view of the front plate prepared in EXAMPLE 4 as still another embodiment of the present invention.

FIG. 5 is a cross-sectional view of the front plate prepared in EXAMPLE 4, which explains still another preferred embodiment of the present invention.

The front plate comprised a glass plate (4) as the transparent substrate, coated with an AR film (7) as the outermost optical film (3), and two adjacent adhesive layers of tackifier layer (19) containing a color-correcting component and heat-bond film (9), in this order. The glass plate (4) was also coated, on the other side, with a transparent, electroconductive layer (18) serving as the electroconductive member and near-infrared ray absorbing layer, two adjacent adhesive layers of heat-bond film (9) and tackifier layer (8), and AR film (7) as the outermost optical film, which were laminated in this order. The multi-layered assembly was placed between mirror-finished plates, treated for degassing, and hot-pressed at 115° C. and 10 kg/cm$^2$ for 15 minutes, to form the monolithic structure.

As described above, the glass plate (4) was coated with the transparent, electroconductive layer (18) serving as the electroconductive member and near-infrared ray absorbing layer, wherein the layer (18) comprised a total of five thin films of zinc oxide and silver (ZnO—Ag—ZnO—Ag—ZnO) laminated orderly by sputtering, and the heat-bond film (9) was an EVA-based heat-bond film (Nihon Matai, ELFAN OH-506) (thickness: 150 m and melting point: 100° C.).

The tackifier layer (8) for the anti-reflection film (7), on the side opposite to the transparent, electroconductive layer (18), was incorporated with Kayaset-BL and Kayaset Blue K-FL (both by Nippon Kayaku) as the color-correcting components. The other members were of the same materials as those for EXAMPLE 1.

EXAMPLE 5

Figure 6:
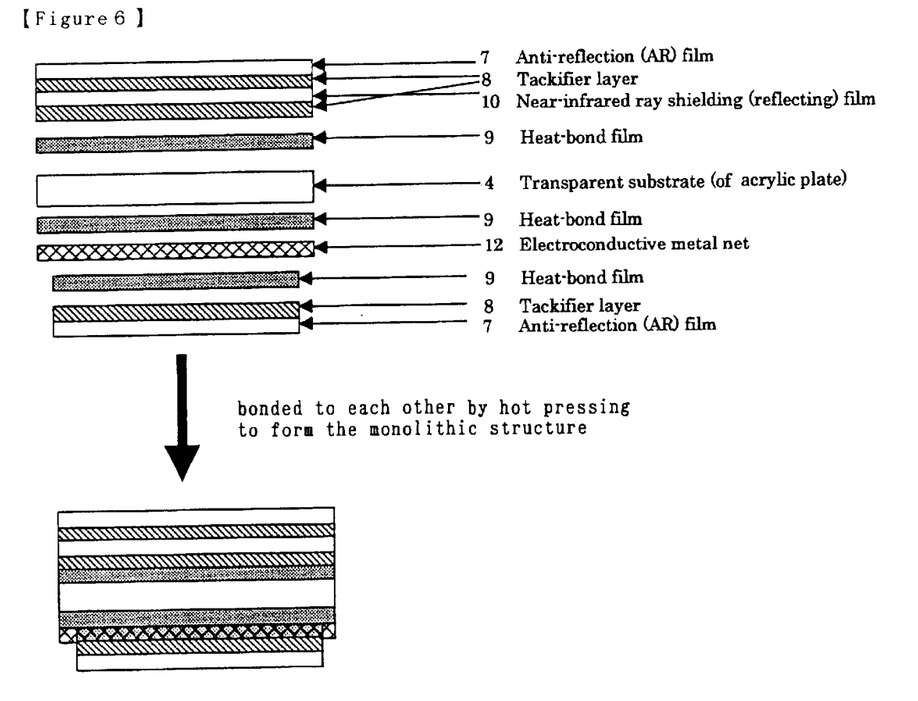
FIG. 6 presents a cross-sectional view of the front plate prepared in EXAMPLE 5 as still another embodiment of the present invention.

FIG. 6 is a cross-sectional view of the front plate prepared in EXAMPLE 5, which explains still another preferred embodiment of the present invention.

The front plate comprised an acrylic plate (4) as the transparent substrate, coated with an outermost optical film (3), and two adjacent adhesive layers of tackifier layer (8) and heat-bond film (9), laminated in this order, wherein the optical film (3) was composed of two or more optical films, i.e., an anti-reflection (AR) film (7) and near-infrared ray absorbing layer (10) which were laminated via a tackifier layer (8). The acrylic plate (4) was also coated, on the other side, with a heat-bond film (9), electroconductive metal mesh (12) as the electroconductive member, heat-bond film (9), tackifier layer (8) and AR film (7) as the outermost optical film, laminated in this order. The multi-layered assembly was placed between mirror-finished plates, treated for degassing, and hot-pressed at 100° C. and 10 kg/cm$^2$ for 60 minutes, to form the monolithic structure.

The acrylic plate (4) as the transparent substrate was an acrylic plate (Nitto Jushi Kogyo, CLAREX) (2 mm thick and 1000 by 600 mm in area), and heat-bond film (9) was an EVA-based heat-bond film (SEKISUI CHEMICAL, S-LEC EN) (thickness: 250 μm and melting point: 80° C.).

The anti-reflection film (7) and near-infrared ray absorbing film (10) were similar to those for EXAMPLE 2, but they were bonded beforehand via the tackifier layer (8). The other members were of the same materials as those for EXAMPLE 2.

COMPARATIVE EXAMPLE 1

Figure 7:
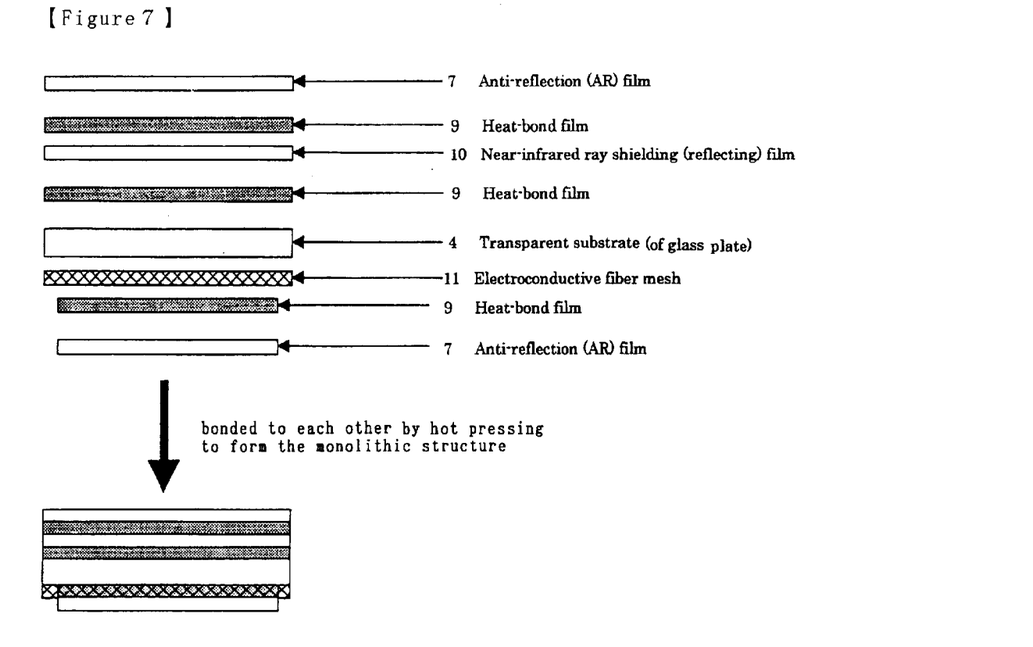
FIG. 7 presents a cross-sectional view of the front plate prepared in COMPARATIVE EXAMPLE 1.

FIG. 7 is a cross-sectional view of the front plate prepared in COMPARATIVE EXAMPLE 1, for comparison with the front plate of the present invention.

The front plate was prepared in the same manner as in EXAMPLE 1, except the tackifier layer (8) was omitted. More concretely, it comprised an optical film (3), transparent substrate (4), and electroconductive member (5) which were bonded to each other by hot pressing only via a heat-bond film (9). These members were hot-pressed at 150° C. and 10 kg/cm$^2$ for 15 minutes, to form the monolithic structure.

COMPARATIVE EXAMPLE 2

Figure 8:
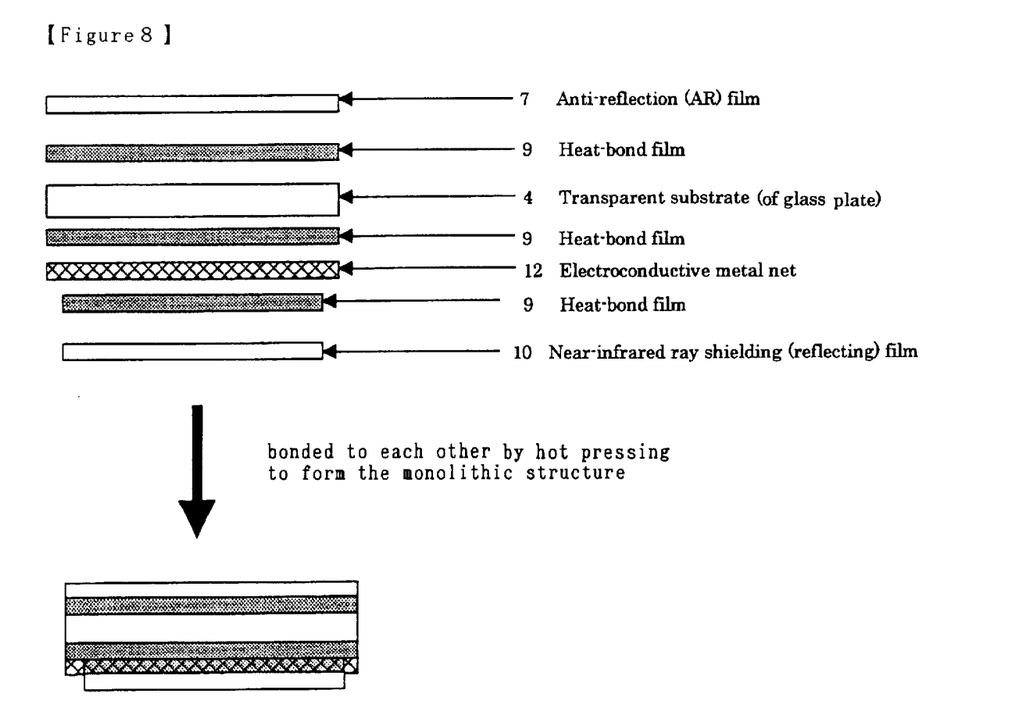
FIG. 8 presents a cross-sectional view of the front plate prepared in COMPARATIVE EXAMPLE 2.

FIG. 8 is a cross-sectional view of the front plate prepared in COMPARATIVE EXAMPLE 2, for comparison with the front plate of the present invention.

The front plate was prepared in the same manner as in EXAMPLE 2, except the tackifier layer (8) was omitted. More concretely, it comprised an optical film (3), transparent substrate (4), and electroconductive member (5) which were bonded to each other by hot pressing only via a heat-bond film (9). These members were hot-pressed at 150° C. and 10 kg/cm$^2$ for 15 minutes, to form the monolithic structure.

COMPARATIVE EXAMPLE 3

Figure 9:
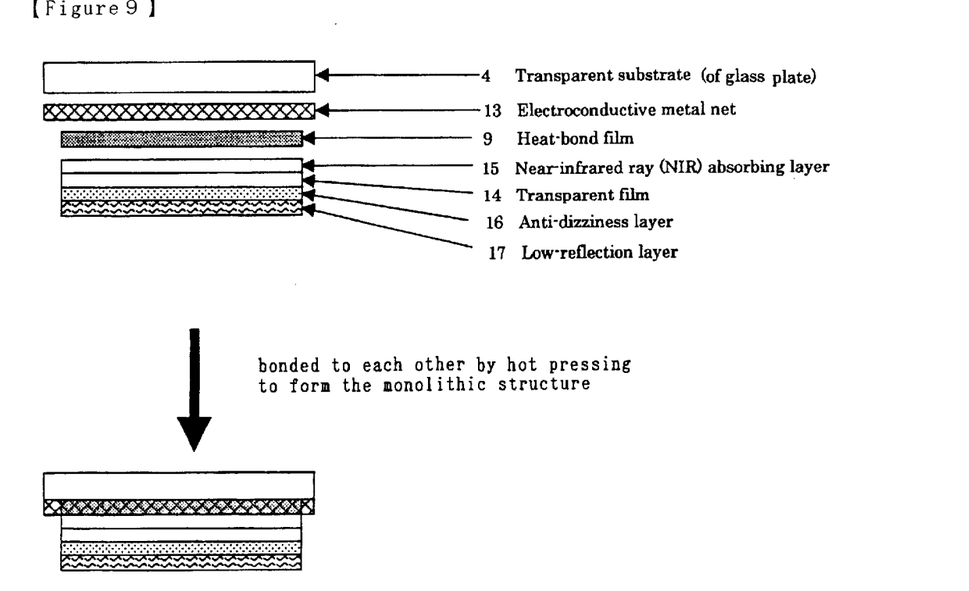
FIG. 9 presents a cross-sectional view of the front plate prepared in COMPARATIVE EXAMPLE 3.

FIG. 9 is a cross-sectional view of the front plate prepared in COMPARATIVE EXAMPLE 3, for comparison with the front plate of the present invention.

The front plate was prepared in the same manner as in EXAMPLE 3, except the tackifier layer (8) was omitted. More concretely, it comprised an optical film (3), transparent substrate (4), and electroconductive member (5) which were bonded to each other by hot pressing only via a heat-bond film (9). These members were hot-pressed at 150° C. and 10 kg/cm$^2$ for 15 minutes, to form the monolithic structure.

EXAMPLE 6

Figure 10:
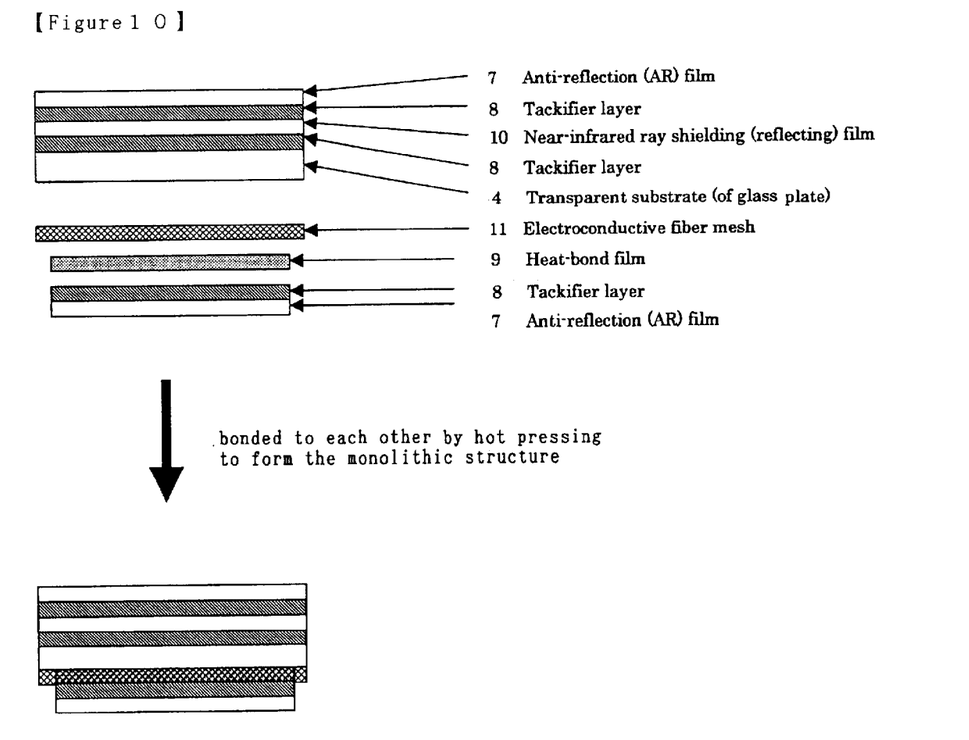
FIG. 10 presents a cross-sectional view of the front plate prepared in EXAMPLE 6 as still another embodiment of the present invention.

FIG. 10 is a cross-sectional view of the front plate prepared in EXAMPLE 6, which explains still another preferred embodiment of the present invention, wherein a transparent substrate was coated with an optical film beforehand, bonded to the side opposite to the electroconductive member. The front plate comprised a glass plate (4) as the transparent substrate, coated with a near-infrared ray absorbing film (10) and AR film (7) as the outermost layer, laminated in this order by the roll pressing lamination method via a tackifier layer (8) between the glass plate (4) and near-infrared ray absorbing film (10), and near-infrared ray absorbing film (10) and AR film (7).

The glass plate (4) was also coated, on the other side, with an electroconductive metal mesh (11) as the electroconductive member (5), two adjacent adhesive layers of heat-bond film (9) and tackifier layer (8), and AR film (7) as the outermost optical film (3), laminated in this order. The multi-layered assembly was placed between mirror-finished plates, treated for degassing, and hot-pressed at 100° C. and 10 kg/cm$^2$ for 60 minutes, to form the monolithic structure. The electroconductive fiber mesh (11) was fast bonded to the glass plate (4) by the adhesive in the heat-bond film (9), laminated on the outside of the electroconductive fiber mesh (11), molten under heating and penetrating into the voids in the electroconductive fiber mesh (11). In such an assembly, the heat-bond film is not required to be placed between the glass and electroconductive fiber mesh, and it was omitted in the front plate of EXAMPLE 6. All of the members for this example were similar to those for EXAMPLE 1.

Each of the front plates for plasma display panels (PDP's) prepared was evaluated for the outer appearances, electromagnetic wave shielding capacity, near-infrared ray shielding capacity and total ray transmittance by the testing methods, described below. The results are given in Table 1.

Method of Evaluating The Outer Appearances of The Front Plate

The front plate assembled by hot pressing into the monolithic structure was visually observed for its outer appearances, and evaluated by irregularities on and warping of the surface. The sample was rated "good," when its surface is smooth, and free of irregularities or warping.

Method of Testing Electromagnetic Wave Shielding Capacity

The electromagnetic wave damping effect was measured in a frequency range from 100 KHz to 1 GHz and evaluated in accordance with the electromagnetic wave shielding testing method (KEC method), developed by Kansai Electronic Industry Development Center. The sample was rated "good," when its electromagnetic shielding (damping) effect of 35 dB or more in the above frequency range.

Method of Testing Near-Infrared Ray Shielding Capacity

The sample was analyzed by a ultraviolet/visible ray spectrophotometer (JASCO Corporation, V-530) to have the spectral pattern, and its near-infrared ray shielding capacity was evaluated by transmittance at 900 nm.

Total Ray Transmittance

Total ray transmittance was determined and evaluated by a turbidimeter (NIPPON DENSHOKU, NDH2000) in accordance with JIS K-7105.

resulting from decomposition of the near-infrared ray absorbing colorant during the production process. The front plates prepared in COMPARATIVE EXAMPLES 1 and 3, with polycarbonate resin as the colorant binder, showed relatively minor decline in near-infrared ray shielding capacity and total ray transmittance, but the one prepared in COMPARATIVE EXAMPLE 2, with acrylic resin as the colorant binder, showed particularly notable decline in near-infrared ray shielding capacity.

INDUSTRIAL APPLICABILITY

The front plate of the present invention for plasma display panels (PDP's) comprises a specific optical film as the outermost layer, transparent substrate and electroconductive member which are laminated by, e.g., hot pressing into a monolithic structure via two types of adjacent adhesive layers of tackifier layer and heat-bond film placed on the inner side of the optical film. The combination of the tackifier layer and heat-bond film allows the optical film to be fast adhered to the transparent substrate or electroconductive member, even when the heating is effected at relatively low temperature, to secure sufficient adhesion durability. Moreover, the front plate of the present invention comprises a specific transparent substrate, electroconductive member and optical film selected for their electromagnetic wave shielding, near-infrared ray shielding, anti-reflection,

TABLE 1

|  | Outer appearances of the front plate | Electromagnetic wave shielding capacity (dB) | Near-infrared ray shielding capacity (%) at 900 nm | Total ray transmittance (%) |
|---|---|---|---|---|
| EXAMPLE 1 | Good | 35 or more (○) | 4 | 47 |
| EXAMPLE 2 | Good | 35 or more (○) | 7 | 55 |
| EXAMPLE 3 | Slight warping observed | 35 or more (○) | 8 | 60 |
| EXAMPLE 4 | Good | 35 or more (○) | 6 | 72 |
| EXAMPLE 5 | Good | 35 or more (○) | 7 | 55 |
| COMPARATIVE EXAMPLE 1 | Irregularities observed, warping observed | 35 or more (○) | 5 | 45 |
| COMPARATIVE EXAMPLE 2 | Irregularities observed, warping observed | 35 or more (○) | 15 | 50 |
| COMPARATIVE EXAMPLE 3 | Irregularities observed, Significant warping observed | 35 or more (○) | 9 | 59 |
| EXAMPLE 6 | Good | 35 or more (○) | 7 | 58 |

As shown in Table 1, each of the front plates prepared in EXAMPLES 1 to 6 and COMPARATIVE EXAMPLES 1 to 3 has an electromagnetic wave shielding capacity of 35 dB or more, and rated "good."

Each of the front plates for PDP's prepared in EXAMPLES 1, 2, 4, 5 and 6 was satisfactorily finished, having a smooth surface and free of warping, also as shown in Table 1. The one prepared in EXAMPLE 3 has a smooth surface and serviceable as the front plate for PDP's, although showing slight warping.

On the other hand, each of the front plates prepared in COMPARATIVE EXAMPLES 1 to 3 showed irregularities on the surface, resulting from deformation of the anti-reflection film, and warping. In particular, the one prepared in COMPARATIVE EXAMPLES 3 was more warped than the others. Each of the front plates prepared in COMPARATIVE EXAMPLES 1 to 3 was more deteriorated in near-infrared ray shielding capacity and total ray transmittance than the ones prepared in EXAMPLES 1 to 3, conceivably anti-dizziness or color-correcting function, to efficiently prevent problems caused by electromagnetic waves and near-infrared ray.

In particular, the members can be bonded to each other at lower temperature, reducing thermal strain in each member, preventing warping of the front plate and also preventing the members, e.g., film, from coming off from the assembly as a result of temporal deterioration. The heating at lower temperature also controls thermal deterioration of the light-controlling coating layer for anti-reflection or anti-dizziness for the optical film, and also controls thermal deterioration of colorant for, e.g., color-correction.

The front plate of the present invention can be assembled by hot pressing in one stage to bond all of the members to each other into a monolithic structure, even when it is more multi-layered with a light-controlling layer, and hence can be produced at high productivity and low cost, and hence economically.

We claim:

1. A front plate for plasma display panels comprising transparent substrate laminated, at least on one side, with an electroconductive member and at least one type of optical film to form a monolithic structure, wherein
   (a) two types of adhesive layers of tackifier layer and heat-bond film are orderly placed between said optical film as the outermost layer and an adjacent member, and
   (b) said transparent substrate, said electroconductive member and said at least one type of optical film are pressed under heating.

2. The front plate for plasma display panels according to claim 1, wherein thickness of said two types of adhesive layers is 10 to 50 $\mu$m thick tackifier layer and 50 to 250 $\mu$m thick heat-bond film.

3. The front plate for plasma display panels according to claim 1 or 2, wherein said optical film member has at least one of the functions selected from near-infrared ray shielding, anti-reflection and anti-dizziness functions.

4. The front plate for plasma display panels according to claim 3, wherein said optical film member further has a color-correcting function.

5. The front plate for plasma display panels according to claim 3 or 4, wherein said near-infrared shielding function is kept by a film of transparent resin dispersed with a near-infrared absorbing colorant or a combination of near-infrared absorbing colorant and color-correcting colorant.

6. The front plate for plasma display panels according to claim 5, wherein said transparent resin is polycarbonate.

7. The front plate for plasma display panels according to one of claim 1 or 2, wherein said electroconductive member is an electroconductive fiber mesh.

8. The front plate for plasma display panels according to one of claim 1 or 2, wherein said electroconductive member is an electroconductive metal net.

9. A method of producing a front plate for plasma display panels, comprising a transparent substrate laminated, at least on one side, with an electroconductive member and at least one type of optical film to form a monolithic structure, wherein
   (a) two types of adhesive layers of tackifier layer and heat-bond film are orderly placed between said optical film as the outermost layer and an adjacent member, and
   (b) at least one type of adhesive layer of tackifier layer or heat-bond film is placed or not placed between the members except those of (a) above, and
   (c) said transparent substrate, electroconductive member and at least one type of optical film are pressed under heating.

10. The method of producing a front plate for plasma display panels according to claim 9, wherein said pressing under heating step is effected at 80 to 120° C.

11. The front plate for plasma display panels according to claim 1, wherein the adjacent member is the electroconductive member.

12. The front plate for plasma display panels according to claim 1, wherein the adjacent member is the transparent substrate.

13. The front plate for plasma display panels according to claim 1, wherein the adjacent member is another optical film member.

14. The method of producing a front plate for plasma display panels according to claim 9, wherein the adjacent member is the electroconductive member.

15. The method of producing a front plate for plasma display panels according to claim 9, wherein the adjacent member is the transparent substrate.

16. The method of producing a front plate for plasma display panels according to claim 9, wherein the adjacent member is another optical film member.

* * * * *